United States Patent [19]

Keim et al.

[11] Patent Number: 5,787,939

[45] Date of Patent: Aug. 4, 1998

[54] METHOD AND APPARATUS FOR REFORMING RADIAL LEADED COMPONENTS

[75] Inventors: Neil Leslie Keim; William Drew Morgan, both of Harrisburg, N.C.

[73] Assignee: International Business Machines Corporation, Armonk, N.Y.

[21] Appl. No.: 798,955

[22] Filed: Feb. 11, 1997

[51] Int. Cl.⁶ .................................................. B21F 45/00
[52] U.S. Cl. ........................................ 140/147; 29/741
[58] Field of Search ............................ 140/147; 29/741, 29/566.3

[56] References Cited

U.S. PATENT DOCUMENTS

| | | |
|---|---|---|
| 2,867,262 | 1/1959 | Ainsworth et al. . |
| 3,374,809 | 3/1968 | Fleckenstein ............... 140/147 |
| 3,616,089 | 10/1971 | Zemek . |
| 3,687,172 | 8/1972 | Suverkropp . |
| 3,798,734 | 3/1974 | Fedor ............................. 29/566.3 |
| 3,799,216 | 3/1974 | Kopczynski . |
| 3,875,978 | 4/1975 | Kopczynski . |
| 3,880,205 | 4/1975 | Linker et al. . |
| 3,892,263 | 7/1975 | Martin et al. . |
| 4,103,719 | 8/1978 | Witt . |
| 4,106,532 | 8/1978 | Gubitose et al. .............. 140/147 |
| 4,122,874 | 10/1978 | Tyner et al. . |
| 4,283,836 | 8/1981 | Janisiewicz et al. . |
| 4,481,984 | 11/1984 | Linker . |
| 4,757,600 | 7/1988 | Holcomb ........................ 29/741 |
| 4,787,426 | 11/1988 | Linker et al. . |
| 4,819,699 | 4/1989 | Brown et al. .................. 29/741 |

FOREIGN PATENT DOCUMENTS

| 62-081234 | 4/1987 | Japan . |
| 1691992 | 11/1991 | U.S.S.R. . |

*Primary Examiner*—Lowell A. Larson
*Attorney, Agent, or Firm*—Whitham, Curtis & Whitham; Richard M. Goldman

[57] ABSTRACT

A method and apparatus for reforming a radial lead of an electronic device and for being mounted on an assembly of a sequencer inserter machine, include first and second die bars, the second die bar being a movable die bar actuated by a stroke of the assembly of the sequencer inserter machine, and at least one push rod for actuating the second die bar in a direction toward the first die bar. As electronic component passes between the first and second die bars, leads of the electronic component are reformed.

21 Claims, 9 Drawing Sheets

METHOD AND APPARATUS FOR REFORMING RADIAL LEADED COMPONENTS

BACKGROUND OF THE INVENTION

The present invention relates to a method and apparatus for reforming bent wire-like workpieces such as component leads, such that the probability of a successful insertion of the component into a printed circuit board/card assembly is greatly improved.

DESCRIPTION OF THE RELATED ART

Machines are known for automatically mounting and assembling leads (e.g., radial leads) of a workpiece (including devices such as a diode, a light emitting diode (LED), a potentiometer, a tact switch, axial leaded components on a radial tape, single in-line packages (SIPs) or the like, having two-or-more-lead configurations), on a printed circuit card.

For example, radial leaded components may be automatically assembled on printed circuit boards (PCBs) or cards using a Universal Instruments Corporation (UIC) 2.5 mm/5 mm RADIAL III SEQUENCER INSERTER PASS-THRU® II COMPATIBLE MODEL 6360A machine 40 or the like, as shown in FIG. 4.

First, individual component part numbers are loaded on the machine 40 in boxes or tape reels. The printed circuit boards may be located on a workboard holder or on rails in a so-called "pass-through" configuration. This may be accomplished manually or automatically. For example, X and Y positioning tables may position the printed circuit boards for component insertions in accordance with a pattern program.

The components are positioned at defined intervals on a carrier tape (e.g., a cardboard carrier tape), and are presented to dispensing head assemblies. Components enter the dispensing heads in a body-up, leads-down orientation. The lead retaining tape may face toward or away from the dispensing head dispensing feed wheel-well, thereby permitting polarized components to be inserted in the correct orientation. Thus, the dispensing head assemblies place the components onto a conveyor chain 41 in the sequence in which they will be inserted into the printed circuit card. Each component on the conveyor chain will have a section of the cardboard carrier tape attached to it. A sprocket wheel 42 advances the components. Chain tensors 43 provide tension to the chain.

Thus, the sequencer chain assembly includes the continuous chain 41 fitted with component carrier clips. The chain 41 extends around a plurality of wheels 42 and is conveyed thereby in an endless loop. The wheels 42 are preferably motor-driven by a servo-motor or the like, with the movement of the chain (and hence the component carrier clips) being precisely controlled. For example, the links of the chain may be provided to correspond to a number of component carrier clips The clips accept components from the dispensing heads and transport the components through the various process stations to the insertion area/head 44.

As the chain transports the components toward the insertion area 44, a cutter assembly removes (e.g., cuts) the carrier tape from each component. The cutter station trims the leads while removing the remaining segment of carrier tape and backing.

Specifically, a segment is cut from the tape and is transferred with the component to a component carrier clip which is carried by a chain assembly. Prior to the component being loaded into the component carrier clip, the dispensing head positions the component carrier clip for component transfer. Each dispensing head includes a sensor for causing an automatic head recycle whenever a component gap is detected in the input tape. If more than a predetermined number of consecutive components are missing from the tape, the process (machine) stops for corrective action (performed either manually or automatically).

The loader assembly transfers components from the carrier clip on the chain assembly to the insertion jaw where it is held by its leads and positioned perpendicularly to the surface of the PCB. Under program control, the component may be rotated in a 90-degrees left or right direction or remain at a 0-degree position for insertion. The insertion jaw lowers the component leads into the PCB holes. The pusher guides the component to its fully seated position and holds it there as the jaw lifts away from the component. When the cut and clinch operation is complete, the pusher withdraws to the home position for the next insertion cycle.

A cutter head unit extends to the bottom of the PCB accepting the component leads as they pass through holes in the PCB. When the component is properly seated on the PCB, the cutter formers cut and clinch the leads to the underside of the PCB. Then, the cutter head lowers allowing the machine to position itself for the next insertion cycle.

Also shown in FIG. 4 is chain unloader area 46, an expanded range verifier 47 for verifying for proper value, and emitters/receivers 48 which for brevity will not be discussed herein. Thus, the above operation frees the component leads for insertion into the printed circuit card mounted on the X and Y positioning table.

However, a problem arises in the above-described process in that, prior to insertion, the components are exposed to many situations which can cause the leads to be bent.

For example, during transport the leads could impact portions of the machine if they become misaligned. Further, the components may be received in boxes or reels with bent leads. This condition may be caused by process problems at the component manufacturer's plant, or by rough handling during shipment. Additionally, component leads may be bent by an operator while opening a box or reel of components, or may be bent during the process of mounting the components on the machine or loading them into the dispensing heads. Furthermore, component leads may be bent by overtravel of the dispensing head mechanism as parts are transferred from the dispensing head to the conveyor chain. Moreover, the component leads may be bent by improper stacking of boxes or reels during storage. This is especially true of conformal coated SIPS which may house up to 10 leads. Specifically, since the machine tooling retains only three of the leads, small bends in the leads may cause the component body to deflect enough to cause a mis-insertion. This is a problem, and potentially results in manufacturing inefficiencies and, if not detected on the manufactured product, performance inefficiencies in the finished circuit board/card assembly.

Further problems of the conventional arrangements are that mis-insertions may drastically increase cycle time and correspondingly reduce throughput. Further, bent leads anywhere in the process often result in component scrap or costly tooling damage. Either of these situations can result in "line-down" conditions. Problems with bent leads also may create frustration and morale problems among manufacturing personnel, as well as create havoc with "Just in-Time" (JIT) methods of manufacturing. If a supply of components is not available near the machine, it may take hours (or longer) to replace them. Thus, bent leads represent a large problem which must be remedied easily and efficiently.

SUMMARY OF THE INVENTION

It is therefore an object of the present invention to provide a method, system and apparatus for reforming bent component leads of an electrical device rapidly and efficiently in a low-cost manner.

Another object is to provide a method, system and lead reforming mechanism for reforming bent component leads such that the probability of a successful insertion of the component into a printed circuit board is greatly improved, and such that insertion of bent leads is greatly minimized.

In a first aspect of the invention, an apparatus for reforming a radial lead of an electronic device and for being mounted on an assembly of a sequencer inserter machine, is provided which includes first and second die bars, the first die bar being a fixed die bar and the second die bar being a movable die bar actuated by a stroke of the assembly of the sequencer inserter machine, and at least one push rod for actuating the second die bar in a direction toward the first die bar. As electronic component passes between the first and second die bars, leads of the electronic component are reformed.

In a second aspect, a method is provided for reforming leads of an electronic component.

In a third aspect, a system is provided for producing printed circuit boards having components mounted thereon in which the leads have been reformed.

With the unique and unobvious structure and method of the invention, existing hardware is utilized and the invention is mounted to an existing lead cutter assembly. Further, no separate processes are required for the lead straightening operation. Additionally, the invention constitutes an in-line mechanism on the existing hardware. There is no impact on machine cycle time.

Thus, with the present invention, costs are reduced since the cost of fabricating hardware to modify an existing machine is much less than that required to purchase an off-the-shelf lead reforming machine. Moreover, as mentioned above, the inventive device mounts on an existing machine and therefore requires no additional floor-space. Since the device is in-line, it does not require a separate operator, as would be the case with an off-line machine. Further, if an off-line machine is used as in the conventional arrangements, the components must be transported to the machine and loaded therein. Component leads may be rebent during this time. The in-line configuration of the present invention avoids such a problem.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
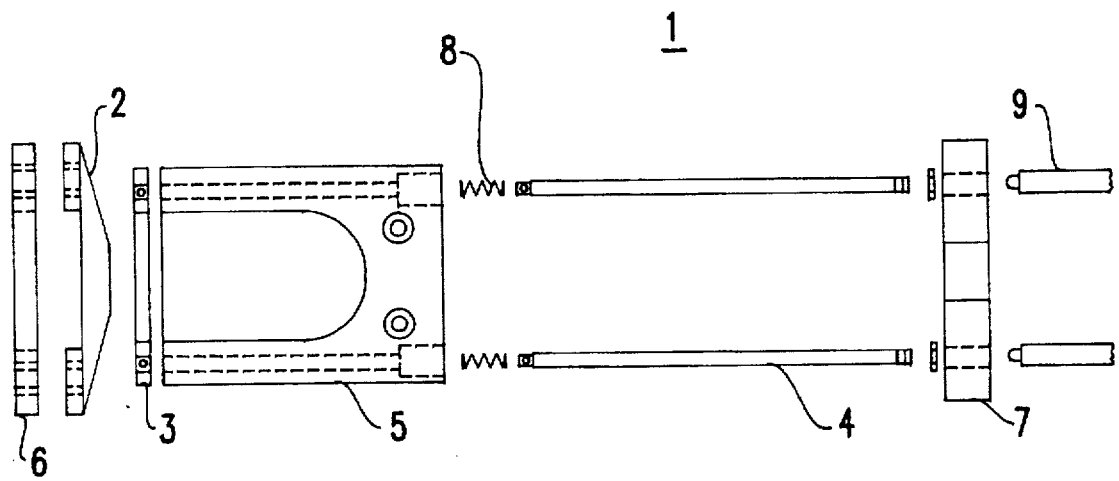
FIGS. 1(A) and 1(B) are diagrams illustrating an exploded plan view and a side view, respectively, of a lead reforming mechanism according to the present invention.

Referring now to the drawings, and more particularly to FIGS. 1(A)-1(B) and 2(A)-2(E), there is shown a first embodiment of the invention and specifically the lead reforming mechanism 1.

Generally, the lead reforming mechanism 1 is an add-on option which is preferably mounted (e.g., by bolts or the like) on the existing cutter assembly 10 of the 6360A machine (e.g., having either a straightback configuration or an in-line configuration) described above and available from Universal Instruments Corporation. Of course, as would be known by one of ordinary skill in the art taking the present specification as a whole, the lead reforming mechanism could be used and mounted on various other assemblies besides a cutter assembly 10 and on various other machines besides the 6360A machine with suitable modifications.

As shown in FIGS. 1(A)-1(B) and 2(A)-2(B), the lead reforming mechanism includes first and second die bars (e.g., blocks) 2, 3. The first and second die bars correspond to a "stationary, inner bar" and a "movable bar" illustrated in FIGS. 2(A) and 2(B), respectively. The stationary die bar 2 is stationary (fixed) and is attached to a mounting plate 6 (e.g., a rear plate) shown in greater detail in FIG. 2(D). Preferably, the stationary die bar 2, which is for mounting to the mounting plate 6, and the movable die bar 3 are formed of stainless steel.

Figure 1B:
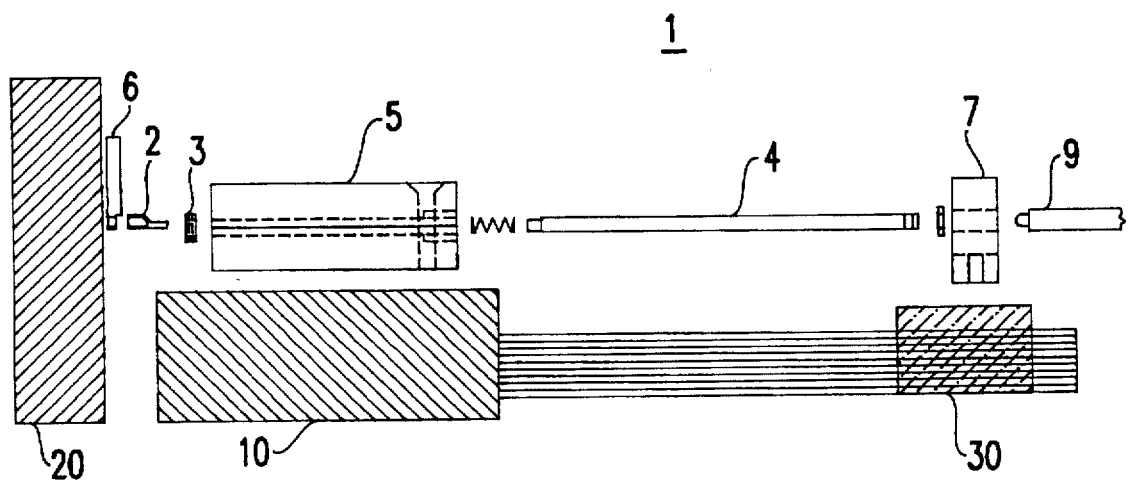
Figure 2A:
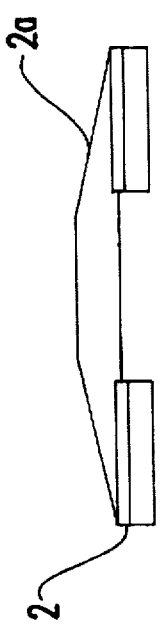
FIG. 2(A) is a plan view of a stationary die bar 2 (e.g., a rear die bar/block) of the lead reforming mechanism according to the present invention shown in FIGS. 1(A) and 1(B)
Figure 2B:
FIG. 2(B) is a front view of a movable die bar 3 (e.g., a front die bar/block) of the lead reforming mechanism according to the present invention shown in FIGS. 1(A) and 1(B)
Figure 2C:
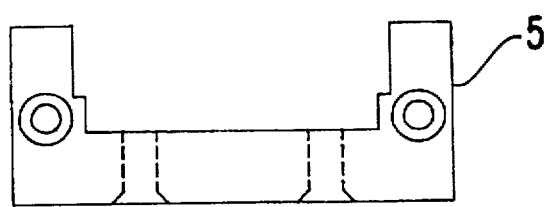
FIG. 2(C) is a front view of a push rod housing 5 of the lead reforming mechanism according to the present invention shown in FIGS. 1(A) and 1(B)
Figure 2D:
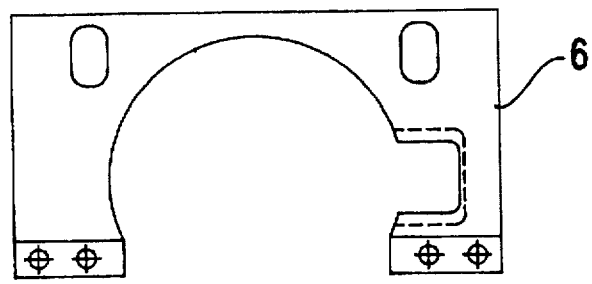
FIG. 2(D) is a front view of a mounting plate (e.g., a rear plate) 6, to which the stationary die bar 2 is mounted, of the lead reforming mechanism according to the present invention shown in FIGS. 1(A) and 1(B)

The movable die bar 3 is actuated by the stroke of the cutter assembly 10 (e.g., through the action of the push rod 4 of FIG. 2D and as shown in FIGS. 1(a) and 1(B)). The die bars 2, 3 are movable relative to one another. Specifically, the movable die bar 3 is movable towards and away from the stationary die bar 2, having therebetween the leads in the carrier clips carried by the chain, thereby to reform and straighten any bent leads. The movable die bar 3 is movable toward and away from the stationary die bar 2 by a controller (e.g., under program control of the 6360A machine, but not illustrated herein) in accordance with the stopping and starting of the chain during operation. As shown in FIGS. 1(A) and 1(B), the lead reform system is mounted in-line on the cutter assembly 10 such that the movable die bar 3 is actuated by the cutter assembly stroke.

As components are processed through the die bars 2, 3, the leads of the components are compressed between the die bars 2, 3 and are reformed (e.g., straightened).

In operation, the stationary die bar, as shown in FIGS. 1(A)-1(B) and 2(A) is bolted to the mounting plate 6 shown in FIG. 2(D), which in turn is bolted to the hold-down wheel assembly 20 on the cutter station of the UIC machine. The stationary die bar 2 is positioned by shims such that its front face (e.g., nearest the component leads) is directly in front of, and in close proximity to, the leads of the component. The movable die bar 3 shown in FIGS. 1(A)-1(B) and 2(B) is attached by screws (not illustrated) to the push rods 4 shown in FIGS. 1(A) and 1(B). The push rods 4 extend through the push rod housing 5 (shown in greater detail in FIG. 2(C)) which is mounted on the machined housing of the cutter assembly 10. The push rods 4 are preferably formed of stainless steel and are parallel to one another.

As shown in FIGS. 1(A)–1(B), compression springs 8 inside the push rod housing 6 hold the movable die bar 3 against the cutter slide 30 on the cutter assembly 10 of the UIC machine. These springs maintain the movable die bar 3 in a home position such that there is a predetermined gap between the two die bars 2, 3. The predetermined gap is set by the designer/operator according to the constraints and requirements of the designer/operator. The gap allows components to enter the area between the die bars 2, 3 prior to actuation of the movable die bar 3. The springs 8 also compensate for the difference in distance between the cutter stroke and the die bar gap.

A plurality of screws (e.g., preferably spring-loaded plunger screws such as Vlier screws) 9 are mounted in the adjustment block 7 (shown in FIG. 2E), which in turn is mounted on the cutter slide 30 at the rear of the cutter assembly 10. In FIGS. 1(A)–1(B), two plunger screws 9 are shown. Further, washers (unreferenced in FIGS. 1(A)–1(B)) may be fitted over the push rods 4 and provided between the adjustment block 7 and an end of the push rods 4 distal from the movable die bar 3.

When the cutter assembly 10 is actuated, the plunger screws 9 respectively contact the push rods 4, thereby moving the movable die bar 3 toward the stationary die bar 2. The component leads, which have been positioned between the die bars 2, 3, are compressed and straightened by the movable die bar 3 against the stationary die bar 2. The screws 9 may be adjusted and locked in position (e.g., via locking nuts or the like) to provide the forward stroke and alignment of the movable die bar 3. The ball plungers in the screws (e.g., Vlier screws) compensate for varying lead diameters and dimensions, thereby making the stroke adjustment less critical.

As a carrier clip containing a component enters the lead reforming device, the component is positioned between the movable die bar 3 and the stationary die bar 2. A lead-in bevel 2a is preferably provided on the front edge of the stationary die bar 2 to allow components to move smoothly into place directly in front of the stationary die bar 2. As the cutter assembly 10 is actuated, the leads are compressed and reformed.

As mentioned above, the push rod housing 5 is preferably a rigid block and is mounted on the machined housing of the cutter assembly 10. FIG. 2(C) illustrates a push rod housing 5 which is for accurately guiding the push rods and the attached movable die bar 3 into contact with the component leads. The push rod housing 5 allows for the transmission of direction of motion of the push rods and accompanying movable die bar 3.

Preferably, the push rods 4 are fixed to the movable die bar 3 and extend through holes in the pushrod housing 5 for reciprocal movement. Thus, the push rods are for guiding the movable die bar 3. As mentioned above, the push rods 4 are activated by the stroke of the cutter assembly such that the movable die bar 3 approaches the stationary die bar 2 to straighten the leads of the components as the cutter assembly 10 is trimming the leads.

Figure 2E:
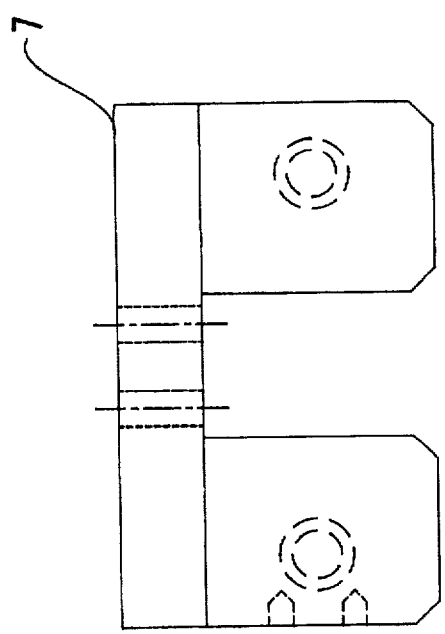
FIG. 2(E) is a front view of an adjustment block 7 of the lead reforming mechanism according to the present invention shown in FIGS. 1(A) and 1(B)

FIG. 2D illustrates a front view of the mounting plate 6 (e.g., mounting bracket) which is for mounting to the hold down wheel assembly 20 of the UIC machine, whereas FIG. 2E illustrates a front view of an adjustment block 7 which is for holding the screws 9 as mentioned above.

As also mentioned above, the leads of each component are connected together by tape along the direction of chain movement. The chain is moved by the plurality of wheels (e.g., at least first and second wheels) as described above. At least one of the wheels is a sprocket wheel driven by a drive mechanism (e.g., a servo-motor) or the like for driving the chain and for precisely positioning the leads between the die bars based on pulses therefrom.

Preferably, the movable die bar 3 moves towards the stationary die bar 2 in a direction perpendicular to an axis of the leads and perpendicular to the direction of chain movement. The leads are straightened at least along the edge of the tape.

Figure 3A:
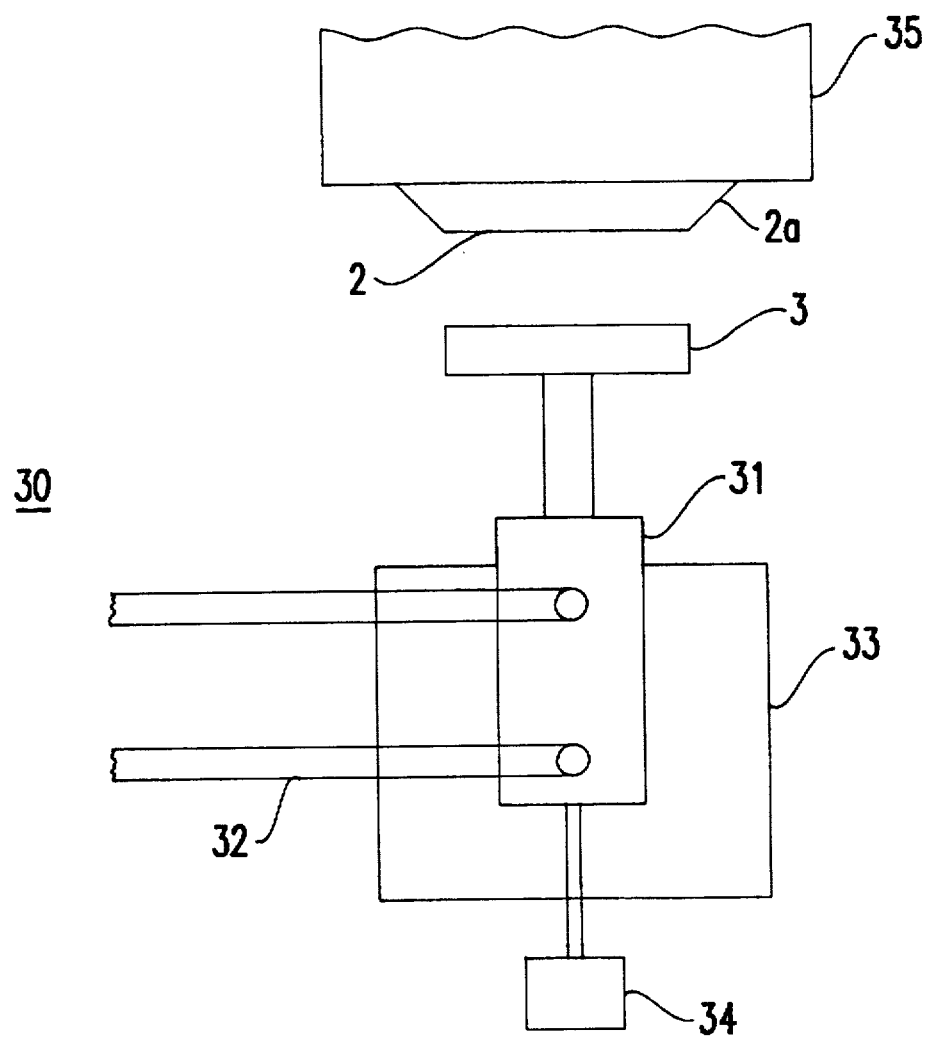
FIGS. 3(A) and 3(B) respectively illustrate top views of second and third embodiments of the present invention.
Figure 3B:
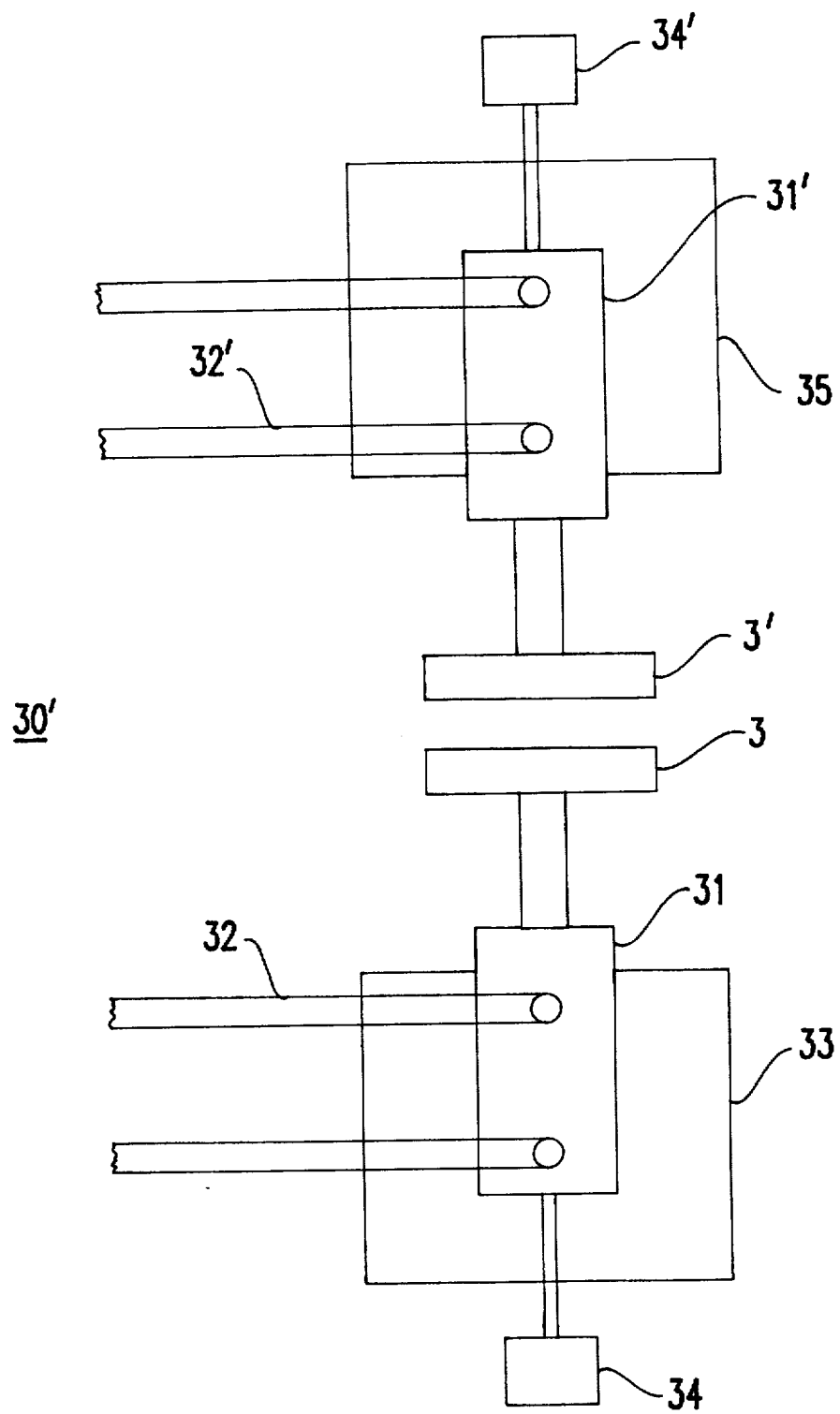

Alternatively, the push rods may be activated by fluid cylinders, and more specifically by air cylinders, as discussed further below in the second and third embodiments of the present invention and as shown in FIGS. 3(A) and 3(B), respectively.

Compression springs 8, as illustrated in FIGS. 1(A) and 1(B), inside the mounting block hold the stationary die bar 2 against the cutter housing in the home position. For purposes of this application, the "home position" is defined as the cutter's position of origin. The springs 8 also compensate for the difference in distance between the cutter stroke and the gap between the die bars 2, 3, and prevent the leads from being damaged.

As mentioned above, the two spring-loaded plunger screws 9, as illustrated in FIGS. 1(A) and 1(B), are mounted in the adjustment block 7 at the rear of the cutter slide and are used to actuate the moveable die bar 3. Screws 9 also provide the forward stroke and alignment adjustments for the stationary die bar 2. Specifically, the plunger screws 9 contact the push rods 4 which actuate the movable die bar 3. The screws also provide stroke and alignment adjustment for the movable die bar 3. The spring action of the plunger screws 9 allows compensation for varying lead diameters/dimensions and makes the stroke and alignment adjustments less critical. However, certain adjustments may be necessary as discussed below.

The die bars 2, 3 preferably are hardened and polished for improved wear characteristics and smoother operation. Preferably, the die bars are formed of stainless steel or the like, and preferably are mounted as separate pieces for ease of replacement.

A combination 0.110"/0.150" height gauge (not illustrated) preferably is provided. The 0.110" section of the gauge is used to set the height of the stationary die bar 2. The 0.150" section of the gauge is used to set the preliminary gap between the plunger screws 9 and the push rods 4.

As mentioned above, from time to time, adjustment may be necessary to the inventive apparatus. For example, a stationary die bar adjustment in a front to back or lateral direction is made with a component in the clip. Preferably, the stationary die bar is positioned behind the component with approximately, for example, 0.005" clearance between the die bar and the component leads. The die bar preferably does not cause the component to tilt forward. This adjustment is obtained by using the proper shims between the die bar mounting plate 6 and the housing for the hold down wheel assembly 20.

For stationary die bar adjustment in a height direction, when the proper shims have been determined to provide the front to back position of the die bar, the locking nuts (not illustrated) for securing the stationary die bar mounting plate 6 are loosened such that die the bar is still snug front to back, but is movable upward and downward. The 0.110" adjustment section is used to set the distance from the top of the carrier clip to the bottom of the die bar. This distance is important for proper operation. Specifically, if the die bar is set too low, there may not be sufficient clearance for the dispensing head tab on the carrier clip. If the die bar is set too high, then it may contact the component body and cause damage.

For movable die bar adjustment, the initial adjustment is done with no component in the clip. The locking nuts (not illustrated) on the movable die adjusting screws 9 (e.g., Vlier screws) are loosened. The gap is set from the nose of the Vlier screws to the push rods at approximately 0.150". Thereafter, the cutter mechanism is actuated using diagnostics or by manually actuating the cutter solenoid. Preferably, there is no gap between the movable and stationary die bars. However, the movable die bar should be movable back from the stationary die bar (e.g., the Vlier screws are not bottomed out). Thereafter, the adjusting screws are locked down.

Final adjustment is performed by slightly bending the leads on several components prior to the cutter station. Thereafter, the components are cycled one at a time through the straightening assembly, and the leads are observed/ measured for precision. Additionally, minor adjustments may be made to the die bars to obtain optimum results.

A method according to the present invention for producing circuit boards having components with reformed leads, includes steps of providing the circuit board substrates, and loading radially leaded components onto the conveyor chain with leads of the component being inserted into the clips on the chain. Thereafter, the chain is moved longitudinally about the plurality of wheels to convey the components to a predetermined station. Thereafter, the chain movement is stopped and the movable die bar is moved toward the fixed die bar with the lead of the component being therebetween.

As a result of moving the movable die bar to the fixed die bar, bent leads are straightened. Thereafter, the movable die bar is moved away from the fixed die bar, and the component is inserted into the circuit board. Then, the chain is moved again to perform another cycle of the operation.

Preferably, component leads are inserted into plated throughholes as leads of other components are inserted into the clips on the chain as the movable die bar is moved towards (and away from) the stationary die bar with the leads of another component between the die bars, when the chain movement is stopped between pulses of the drive mechanism (e.g., servo-motor). As mentioned above, the drive motor moves the movable die bar toward the stationary die when the chain movement is stopped and moves the movable die bar away from the stationary die bar before the chain starts moving again, is controlled by the controller (e.g., program) of the 6360A machine.

The first embodiment may be employed with the UIC Radial Lead Sequencer/Inserter machine described above and which is available with an optional verifier assembly. This configuration includes first and second opposing sets of test contacts which close on the component leads for purposes of electrical component verification. The mechanical operation of the verifier is similar to that described above. This assembly could be modified to incorporate die bars for the purpose of reforming component leads.

Second Embodiment

In a second embodiment of the present invention as shown in FIG. 3(A), a mechanism 30 operated by at least one air cylinder 31 is preferably mounted separately from the cutter assembly 10. Of course, with suitable modifications, the air cylinder arrangement with the movable die bar could be used additionally to the stroke of the cutter assembly.

As shown in FIG. 3(A), structures which are the same as the first embodiment are shown with the same reference numerals and, for brevity, further discussion of these structural elements will be omitted. As shown, lines 32 (e.g., air lines or the like) are extended from existing supplies and coupled to the air cylinder 31. The air cylinder 31 is mounted on a first mounting block 33, and is coupled to an electrical connector 34 for supplying power thereto. The air cylinder 31 activates the movable die bar 3 toward the stationary die bar 2 mounted on a second mounting block 35.

Figure 4:
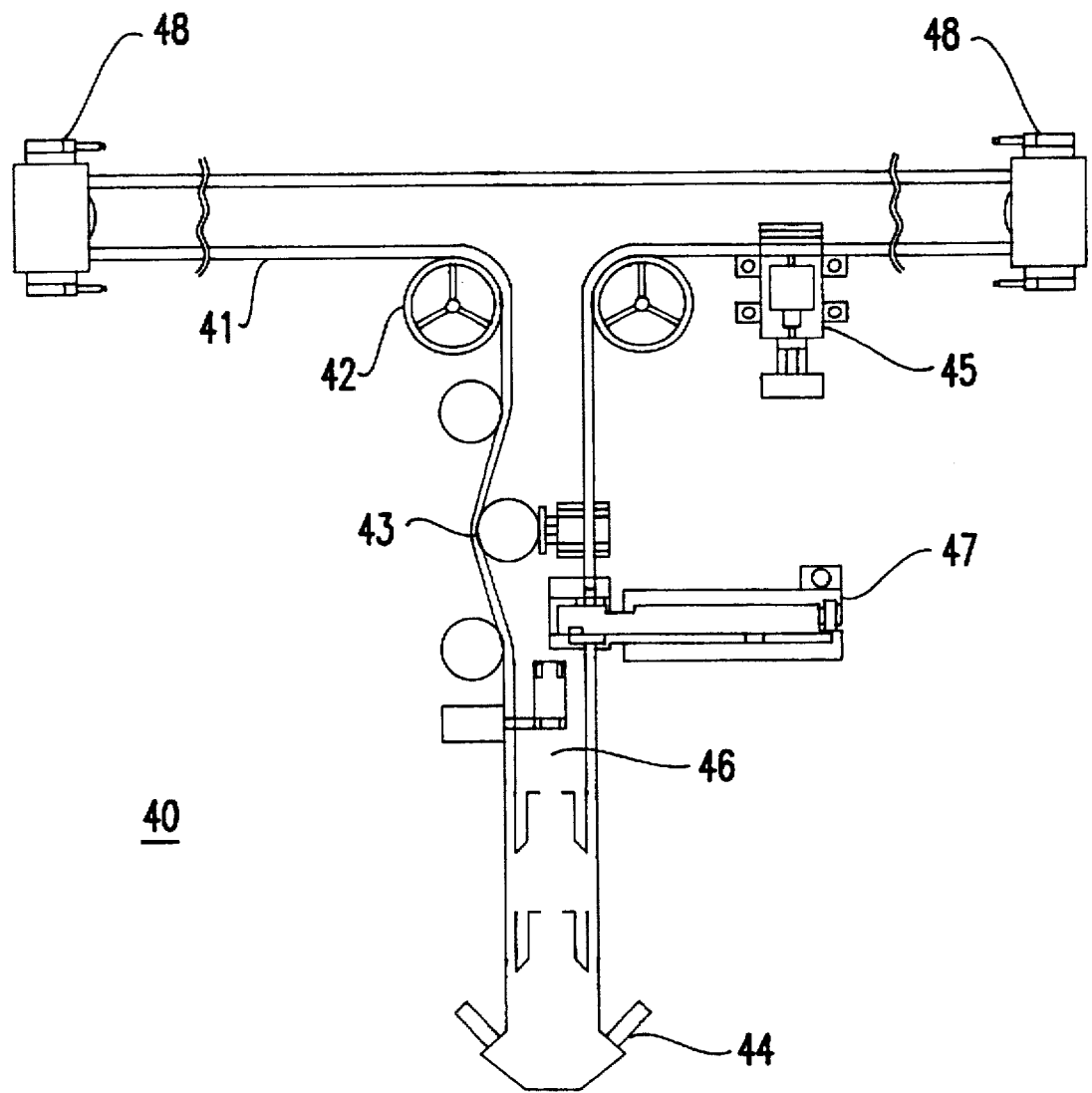
FIG. 4 illustrates the conventional Universal Instruments Corp. 2.5 mm/5 mm RADIAL III SEQUENCER INSERTER PASS-THRU° II COMPATIBLE MODEL 6360A machine (e.g., in-line configuration) for use with the present invention.

Preferably, pneumatics and electronic actuation are tapped from the cutter assembly 10 or, if available, from the verifier station 47 shown in FIG. 4. As mentioned above, the verifier section is for verifying certain component values and polarities. Additionally, a reforming device mounted at this station is preferably mounted next to the verifier station in the configuration shown in the second embodiment.

Third Embodiment

In a third embodiment of the present invention as shown in FIG. 3(B), a mechanism 30' is operated by two air cylinder 31, one for each die block, and is preferably mounted separately from the cutter assembly As shown in FIG. 3(B), structures which are the same as the second embodiment are shown with the same reference numerals and, for brevity, further discussion of these structural elements will be omitted. As shown, lines 32 (e.g., air lines or the like) are extended from existing supplied and coupled to the air cylinder 31. The air cylinder 31 is mounted on a first mounting block 33, and is coupled to an electrical connector 34 for supplying power thereto. The air cylinder 31 activates the movable die bar 3 in a direction toward a second movable die bar 3' mounted on a second mounting block 35. The second movable die bar 3' is activated by an air cylinder 31' having lines 32 (e.g., air lines or the like) extending from existing supplied and coupled to the air cylinder 31'. The air cylinder 31' is mounted on a mounting block 35, and is coupled to an electrical connector 34' for supplying power thereto. The air cylinder 31' activates the second movable die bar 3' in a direction toward the first movable die bar 3.

Preferably, pneumatics and electronic actuation are tapped from the cutter assembly 10 or, if available, from the verifier station 47 shown in FIG. 4. As mentioned above with regard to the second embodiment, the air cylinder arrangement with the movable die bars may be used additionally or alternatively to the stroke of the cutter assembly. Additionally, a reforming device mounted at this station is preferably mounted next to the verifier station in the configuration shown in the second embodiment.

The design of the third embodiment affords the advantage of increased space for larger components. Also, by utilizing actuation of both die bars, the die bars are positionable to avoid the dispensing head tabs on the carrier clips. Such a design allows the height of the die bars to be increased and expands the surface area over which the reforming action is applied to the leads.

With the unique and unobvious structure and method of the invention, existing hardware is utilized and the invention is mounted to an existing lead cutter assembly. Further, no separate operations are required for the lead straightening and the components are not exposed to additional lead-bending conditions.

Additionally, the invention constitutes an in-line mechanism on the existing hardware. There is no impact on machine cycle time, and no separate processes are required for the lead straightening operation. Additionally, with the invention, the cost of fabricating hardware to modify an existing machine is much less than that required to purchase an off-the-shelf lead reforming machine. Moreover, since the inventive device mounts on an existing machine, no additional floor-space is required. Further, since the device is an in-line structure, it does not require a separate operator, as would be the case with an off-line machine. Further, if an off-line machine is used, the components must be transported to the machine and loaded. Component leads may be rebent during this time. The in-line configuration of the present invention avoids such a problem.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. An apparatus for reforming a radial lead of an electronic component comprising:

first and second die bars, said second die bar being a moveable die bar ;

at least one pushrod for actuating said moveable die bar in a direction toward said first die bar; and a actuable adjustment block having an aperture with a spring loaded plunger adjustably mounted therein for slidably receiving and adjustable contacting an end of said at least one pushrod relative to said actuable adjustment block, wherein, as said electronic component passes between said first and second die bars and said movable adjustment block is actuated, leads of said electronic component are reformed.

2. An apparatus according to claim 1, further comprising a push rod housing for housing said at least one push rod, said at least one push rod extending through said push rod housing and being coupled to said second die bar.

3. An apparatus according to claim 2, wherein a plurality of push rods are provided.

4. An apparatus according to claim 2, further comprising a compression spring mounted in said push rod housing for holding the second die bar in a home position when not actuated.

5. An apparatus according to claim 1, further comprising:

a fluid cylinder, coupled to said movable die bar, for actuating said movable die bar in conjunction with said stroke of said assembly.

6. An apparatus according to claim 1, further comprising:

first and second fluid cylinders respectively coupled to said movable die bar and said first die bar, for actuating said movable die bar and said first die bar, respectively, toward one another in conjunction with said stroke of said assembly, said first die bar being a movable die bar.

7. An apparatus according to claim 1, wherein said movable die bar is actuated during a normal cycle time of said machine.

8. An apparatus according to claim 1, wherein said spring-loaded plunger is adjustable and lockable to provide stroke adjustment and alignment of said movable die bar.

9. An apparatus according to claim 1, wherein said spring-loaded plunger includes means for compensating for varying lead dimensions.

10. An apparatus according to claim 1, wherein said first die bar includes a lead-in bevel for allowing components to enter into a reforming area.

11. An apparatus as recited in claim 1, further including means for attaching said apparatus to a sequencer/inserter machine.

12. An apparatus as recited in claim 11, wherein said actuable adjustment block and said second die bar are actuated by a cutter assembly of said sequencer/inserter machine.

13. A method of reforming leads of an electronic component, for use with a sequencer inserter machine having an assembly, said method comprising steps of:

loading a component having a lead onto a clip on a chain;

conveying the chain to move the component to a predetermined station between a first die bar and a second, moveable die bar; and moving said moveable die bar toward the first die bar with said lead of said component therebetween by contacting a linkage to said moveable die bar with a spring loaded plunger adjustably mounted in an actuable adjustment block, thereby to straighten said lead, said moveable die bar being actuated by a stroke of said assembly of said sequencer machine which actuates said actuable adjustment block.

14. An automated assembly system, comprising:

a sequencer/inserter machine including a cutter assembly for trimming leads of an electronic component and for mounting said component onto printed circuit boards; and a device for reforming a radial lead of the electronic component , said device including:

first and second die bars, said second die bar being a moveable die bar relative to said first die bar ; at least one push rod for actuating said moveable die bar in a direction toward said first die bar; and a actuable adjustment block having an aperture with a spring loaded plunger adjustable mounted therein for slidably receiving and adjustable contacting an end of said at least one pushrod relative to said actuable adjustment block, wherein, as said electronic component passes between said first and second die bars and said actuable adjustment block is actuated, leads of said electronic component are reformed.

15. A system according to claim 14, further comprising a push rod housing for housing said at least one push rod, said at least one push rod extending through said push rod housing and being coupled to said second die bar.

16. A system according to claim 14, wherein said movable die bar is actuated during a normal cycle time of said machine, wherein said spring-loaded plunger screws are adjustable and lockable to provide stroke adjustment and alignment of said movable die bar, and wherein said spring-loaded plunger screws include means for compensating for varying lead dimensions, said first die bar including a lead-in bevel for allowing components to enter into a reforming area.

17. A system according to claim 14, further comprising a fluid cylinder, coupled to said movable die bar, for actuating said movable die bar in conjunction with said stroke of said cutter assembly.

18. A system according to claim 14, further comprising first and second fluid cylinders, coupled to said first die bar and said movable die bar, respectively, for actuating said first die bar and said movable die bar.

19. A system as recited in claim 14, further including means for attaching said apparatus to a cutter of said sequencer/inserter machine.

20. A system as recited in claim 19, wherein said actuable adjustment block and said second die bar are actuated by a cutter assembly of said sequencer inserter machine.

21. An apparatus according to claim 14, further comprising a compression spring mounted in a push rod housing for holding the second die bar in a home position when not actuated.

* * * * *